US007163602B2

(12) United States Patent
Ogle (10) Patent No.: US 7,163,602 B2
(45) Date of Patent: Jan. 16, 2007

(54) APPARATUS FOR GENERATING PLANAR PLASMA USING CONCENTRIC COILS AND FERROMAGNETIC CORES

(76) Inventor: John S. Ogle, 1472 Pashote Ct., Milpitas, CA (US) 95035

( * ) Notice: Subject to any disclaimer, the term of this patent is extended or adjusted under 35 U.S.C. 154(b) by 135 days.

(21) Appl. No.: 10/383,427

(22) Filed: Mar. 7, 2003

(65) Prior Publication Data

US 2004/0175953 A1    Sep. 9, 2004

(51) Int. Cl.
*H01L 21/306* (2006.01)
*C23C 16/00* (2006.01)
(52) U.S. Cl. .............. 156/345.48; 118/723 I
(58) Field of Classification Search .......... 118/723 I, 118/723 IR, 723 AN; 156/345.48, 345.49; 315/111.14, 111.51
See application file for complete search history.

(56) References Cited

U.S. PATENT DOCUMENTS

| 4,948,458 A | 8/1990 | Ogle ................. 156/643 |
| 5,277,751 A | 1/1994 | Ogle ................. 156/643 |
| 5,435,881 A | 7/1995 | Ogle ................. 156/345 |
| 5,944,942 A | 8/1999 | Ogle ................. 156/345 |
| 5,994,236 A | 11/1999 | Ogle ................. 438/728 |
| 6,204,607 B1 * | 3/2001 | Ellingboe ........... 315/111.51 |
| 6,462,483 B1 | 10/2002 | Jeng et al. .......... 315/111.51 |
| 2004/0060517 A1 * | 4/2004 | Vukovic et al. ........ 118/723 I |

* cited by examiner

*Primary Examiner*—Luz Alejandro-Mulero
(74) *Attorney, Agent, or Firm*—Schneck & Schneck; Thomas Schneck (57) ABSTRACT

A plasma source using a combination of concentric coils and ferromagnetic cores drives a radio frequency magnetic flux with controlled radial magnitude variation through a window into a reduced pressure process chamber, to provide improved plasma generation efficiency and ease of process uniformity adjustment.

1 Claim, 7 Drawing Sheets

APPARATUS FOR GENERATING PLANAR PLASMA USING CONCENTRIC COILS AND FERROMAGNETIC CORES

BACKGROUND

1. Field of Invention

This invention relates to plasma sources, primarily for processing workpieces such as semiconductor wafers or flat panel displays.

2. Description of Prior Art

Plasma sources are used to generate ionized gas plasmas to provide energy for modifying the surface of workpieces such as semiconductor wafers or flat panel displays. These surface modifications include etching selected portions of the surface, chemically modifying the surface, cleaning the surface, and depositing materials on the surface. Critical characteristics of plasma sources include controllable plasma density, controllable plasma uniformity, direction and magnitude control of ion kinetic energy, and minimum damage to either the workpiece or the process chamber.

Plasma sources are also used to provide ions for high energy ion implantation below the surfaces of workpieces.

Ogle, in U.S. Pat. No. 4,948,458, METHOD AND APPARATUS FOR PRODUCING MAGNETICALLY-COUPLED PLANAR PLASMA, describes the first high density plasma source generating a planar plasma conforming to the shape of a semiconductor wafer, by driving radio frequency current through a planar spiral coil to couple magnetic energy through a window into free electrons in the process gases by transformer action. While a dramatic step forward, this source does not provide easy means of optimizing uniformity, and wastefully generates a magnetic field above the coil, where it is not useful.

Ogle, in U.S. Pat. No. 5,277,751, METHOD AND APPARATUS FOR PRODUCING LOW PRESSURE PLANAR PLASMA USING A COIL WITH ITS AXIS PARALLEL TO THE SURFACE OF A COUPLING WINDOW, describes a planar plasma source using a coil with its axis parallel to the workpiece surface to generate a planar plasma. This plasma source accelerates free electrons in the process gas in a linear motion, rather than in a circular motion, as in U.S. Pat. No. 4,948,458.

Ogle, in U.S. Pat. No. 5,435,881, APPARATUS FOR PRODUCING A PLANAR PLASMA USING VARYING MAGNETIC POLES, describes a planar plasma source using spaced opposite polarity varying magnetic poles to generate a planar plasma.

Ogle, in U.S. Pat. No. 5,944,942, VARYING MAGNETIC POLES SOURCE, describes improvements in varying magnetic pole plasma sources, including the use of a metal structure with small oval windows in place of the large insulating window used with the earlier planar plasma sources. When used with ferromagnetic cores this plasma source greatly reduces the wasted magnetic flux away from the process chamber. In addition, adjusting the vertical positions of the ferromagnetic cores provides an easy method of optimizing uniformity, and the metal structure provides an effective voltage reference plane.

While plasma sources using spaced varying magnetic poles provide the optimum planar plasma, they require a relatively complicated structure to support and connect the coils and ferromagnetic cores.

Ogle, in U.S. Pat. No. 5,994,236, PLASMA SOURCE WITH PROCESS NONUNIFORMITY IMPROVED USING FERROMAGNETIC CORES, describes the use of ferromagnetic cores with magnetically coupled plasma sources to improve process nonuniformity and increase efficiency.

Jeng et al, in U.S. Pat. No. 6,462,483, INDUCTION PLASMA PROCESSING CHAMBER, describes a solenoidal coil with its axis perpendicular to a coupling window to couple varying magnetic flux into a process chamber. This coil arrangement concentrates the varying magnetic flux adjacent to the coil turns, with relatively little varying magnetic flux near the center of the coil. In addition, most of the magnetic field energy is stored in the volume above the coupling window, and so does not contribute to plasma generation inside the chamber. The coil inductance can be greatly affected by the conductive support structure of the chamber. In particular, if there is a conductive aperture below the coil with a diameter only slightly larger than the coil diameter, the inductance of the coil is significantly reduced, resulting in large currents for a given radio frequency magnetic flux coupled into the chamber.

SUMMARY

The plasma source invention uses at least two concentric coils, with the outermost coil consisting of at least one shorted turn to confine radio frequency magnetic flux, a radio frequency voltage driven coil smaller than and concentric with the outermost coil to generate radio frequency magnetic flux. A window passes radio frequency magnetic flux into a reduced pressure process chamber to ionize process gases. Return path ferromagnetic cores between the outermost coil and the radio frequency voltage driven coil increase the inductance of the radio frequency voltage driven coil. Uniformity enhancement ferromagnetic cores placed inside radio frequency driven coil control the radial distribution of radio frequency magnetic flux.

Accordingly, several objects and advantages of my invention are to provide a novel plasma source derived using Faraday's law, one of Maxwell's equations, to provide a substantially rotationally uniform radial radio frequency magnetic flux. This rotationally uniform magnetic flux results from generating two opposite polarity vertical magnetic flux regions through a coupling window forming the upper surface of a reduced pressure process chamber. One vertical magnetic flux region is near the center of the coupling window, and the other magnetic flux region is near the periphery of the coupling window. Since, by another of Maxwell's equations, all magnetic flux forms a closed path, these two vertical magnetic flux regions are connected by a radial radio frequency magnetic flux which passes through a coupling window and the part of a reduced pressure process chamber adjacent to the coupling window.

The resulting radio frequency radial magnetic flux causes free electrons in the gas inside the reduced pressure process chamber to be accelerated in a rotating direction about the center of the coupling window. Free electrons accelerated to a kinetic energy greater than the ionization energy of process gas molecules create more free electrons and positive ions by striking and removing outer orbit electrons from the gas molecules. One advantage of using a rotationally uniform radio frequency magnetic flux is that electron acceleration is entirely parallel to the coupling window, so the accelerated free electrons rarely strike the process chamber interior surfaces and do not contribute significantly to the bias voltage between the plasma and the reduced pressure process chamber.

The integral form of Faraday's law states that the line integral of the voltage surrounding a surface is equal to the negative of the surface integral of the time derivative of the magnetic flux passing through that surface.

An extension of Faraday's law states that the voltage across the ends of a closely spaced coil is equal to the number of turns of the coil times the surface integral of the time derivative of the magnetic flux passing through the coil.

Thus, for a closely spaced coil, the root mean square sinusoidal waveform magnetic flux passing through the inside of the coil is equal to the root mean square sinusoidal voltage applied across the ends of the coil, divided by the product of the frequency and the number of coil turns. This is true independent of the magnetic permeability of materials inside or adjacent to the coil. However, placing ferromagnetic materials inside and adjacent to the coil can greatly affect the inductance of the coil and the location of the magnetic flux inside the coil.

Thus a judicious placement of ferromagnetic cores in combination with multiple concentric coils can provide both improved process uniformity and reduced resistive losses in the coils, due to the lower current resulting from higher coil inductance. A suitable ferromagnetic material for this application is the M2 type ferrite core material manufactured by National Magnetics of Bethlehem, Pa.

Conductive surfaces can also be used to prevent the passage of radio frequency magnetic flux through selected areas, to provide additional process uniformity control. Additional concentric coils, combined with additional ferromagnetic cores, can be designed, based on Faraday's law, to provide additional radial uniformity control, by controlling the voltage to turns ratio of each coil, and thus the relative radio frequency magnetic flux through the interior of each coil.

Suitable means for controlling the relative voltage to turns ratio for each voltage driven coil include using different numbers of turns for each coil with the same voltage applied across all coils or using one or more transformers or impedance divider networks to provide the desired voltage to turns ratio for coils with the same or different numbers of turns.

Still further objects and advantages will become apparent from a consideration of the ensuing description and accompanying drawings.

PREFERRED EMBODIMENT—DESCRIPTION

The plasma source consists of means to apply radio frequency voltage across selected concentric coils to generate a rotationally uniform radio frequency magnetic flux pattern, combined with ferromagnetic cores to increase the inductance of the concentric coils and to concentrate the radio frequency magnetic flux in desired locations, and a window through which the radio frequency magnetic flux passes into a reduced pressure process chamber to generate a plasma.

Figure 1:
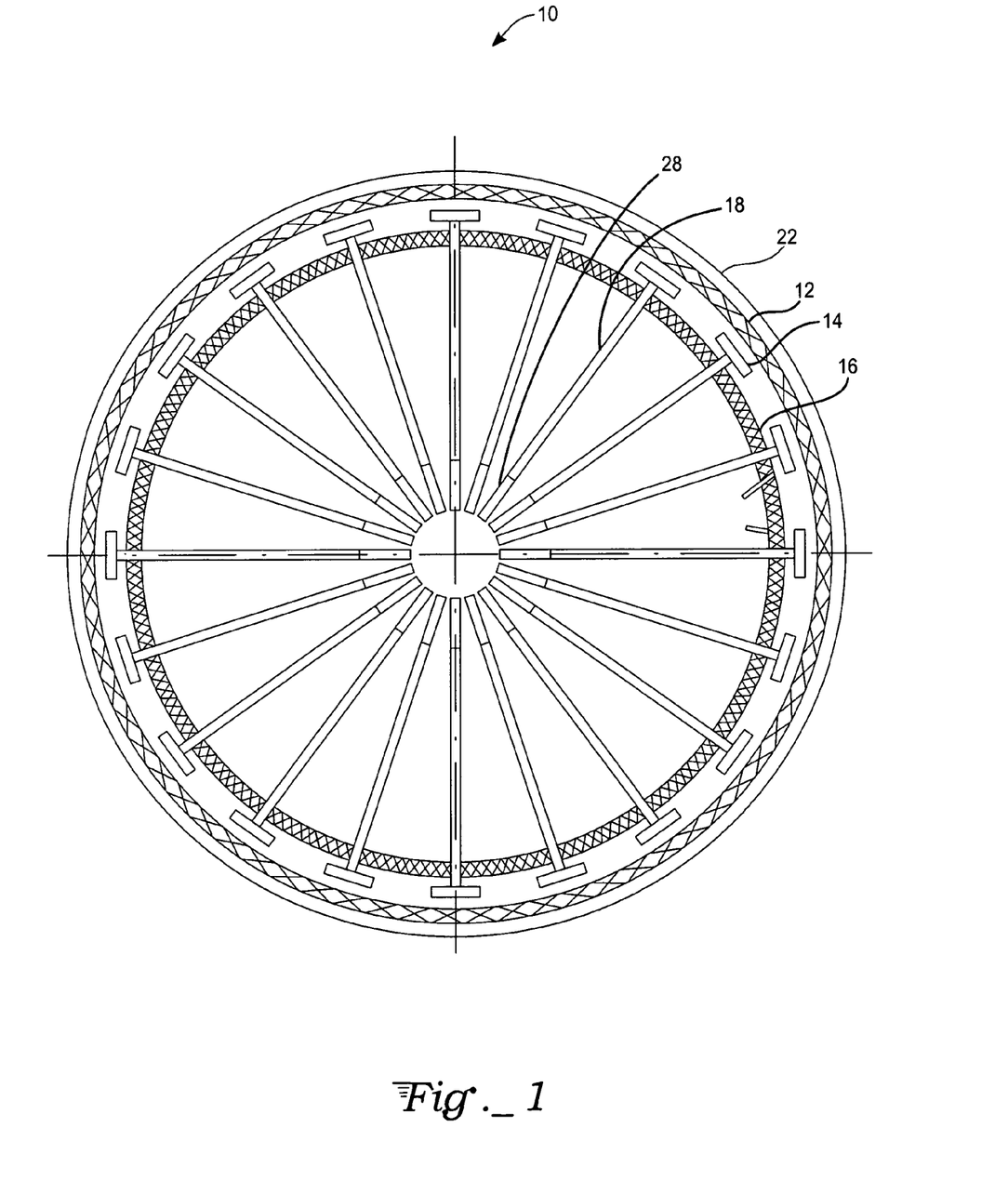
FIG. 1 is a plan view of a two concentric coil planar plasma source, showing a magnetic flux confining shorted turn coil, return path ferromagnetic cores, outer radio frequency powered magnetic flux generating coil, an inner circle of uniformity enhancement ferromagnetic cores, and bridging ferromagnetic cores.

FIG. 1 is a plan view showing the locations of the concentric coils and ferromagnetic cores of a two coil embodiment of concentric coil planar plasma source 10. Concentric coils include magnetic flux confining shorted turn coil 12 and outer radio frequency powered magnetic flux generating coil 16. Ferromagnetic cores include a circle of units of U shaped ferromagnetic core assembly 20, each consisting of return path ferromagnetic core 14, inner uniformity enhancement ferromagnetic core 28, and bridging ferromagnetic core 18. Return path ferromagnetic core 14 is placed between magnetic flux confining shorted turn coil 12 and outer radio frequency powered magnetic flux generating coil 16. Inner uniformity enhancement ferromagnetic core 28 is placed near the center of window for magnetic flux 22.

Since there is no voltage across magnetic flux confining shorted turn coil 12, by Faraday's law the sum of radio frequency magnetic flux inside magnetic flux confining shorted tun coil 12 is zero. Radio frequency voltage is applied across outer radio frequency powered magnetic flux generating coil 16, so there is radio frequency magnetic flux passing inside outer radio frequency powered magnetic flux generating coil 16. Since the sum of radio frequency magnetic flux inside magnetic flux confining shorted turn coil 12 is zero, the radio frequency magnetic flux between magnetic flux confining shorted turn coil 12 and outer radio frequency powered magnetic flux generating coil 16 is equal and opposite to the radio frequency magnetic flux through outer radio frequency powered magnetic flux generating coil 16.

Figure 2:
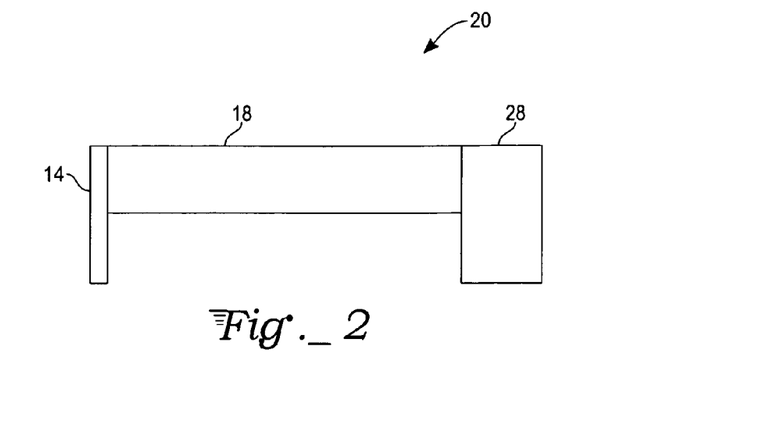
FIG. 2 is a side view showing a ferromagnetic core assembly, combining a return path ferromagnetic core, a uniformity enhancement ferromagnetic core and a bridging ferromagnetic core to provide a U shaped core assembly.

FIG. 2 shows a unit of U shaped ferromagnetic core assembly 20, comprised of return path ferromagnetic core 14, inner uniformity enhancement ferromagnetic core 28, and bridging ferromagnetic core 18.

Figure 3:
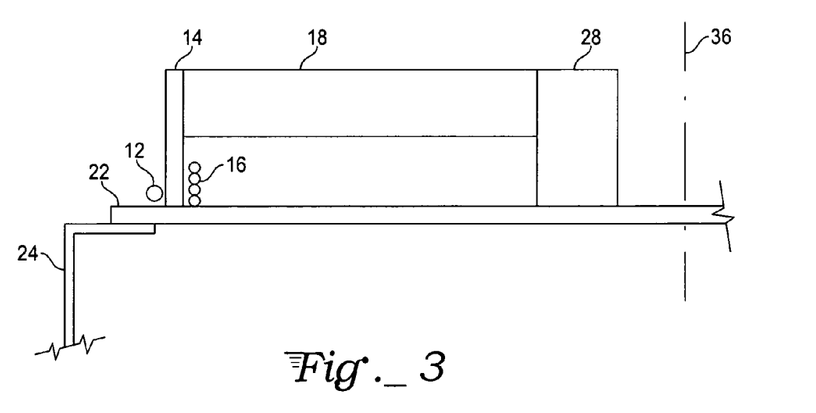
FIG. 3 is a side view of a radius of a two concentric coil planar plasma source, showing the locations of the magnetic flux confining shorted turn coil, return path ferromagnetic core, outer magnetic flux generation coil, uniformity enhancement ferromagnetic core, and bridging ferromagnetic core.

FIG. 3 is a side view of a radius of concentric coil planar plasma source 10 showing the locations of the concentric coils and ferromagnetic cores of a two coil embodiment of concentric coil planar plasma source 10. In order of decreasing radius are magnetic flux confining shorted turn coil 12, return path ferromagnetic core 14, outer radio frequency powered magnetic flux generating coil 16, inner uniformity enhancement ferromagnetic core 28, and concentric coil source axis 36. The purposes of bridging ferromagnetic core 18 are to increase the inductance of outer radio frequency powered magnetic flux generating coil 16 and to provide structural support and spacing for return path ferromagnetic core 14 and inner uniformity enhancement ferromagnetic core 28. Without units of U shaped ferromagnetic core assembly 20, the magnetic flux through outer radio frequency powered magnetic flux generating coil 16 would be concentrated near the turns of outer radio frequency powered magnetic flux generating coil 16. In addition, the inductance of outer radio frequency powered magnetic flux generating coil 16 would be very small, resulting in excessive radio frequency current for a given radio frequency magnetic flux, with large resistive power losses. Units of U shaped ferromagnetic core assembly 20 concentrate the radio frequency magnetic flux toward the center of outer radio frequency powered magnetic flux generating coil 16. There are well established methods for controlling the different gas flow rates into and controlling the gas pressure inside reduced pressure plasma process chamber 24. There are also well established methods for introducing and removing semiconductor wafers or other workpieces in reduced pressure plasma process chamber 24, and to mount or clamp these workpieces to a support structure, and to provide temperature control for both the workpieces and walls of reduced pressure plasma process chamber 24. There are also well established methods for providing impedance matching between radio frequency generators and resistively loaded coils such as outer radio frequency powered magnetic flux generating coil 16. The detailed configuration of the method used for these functions are not significant to this invention.

Preferred Embodiment—Operation

As radio frequency voltage is applied across outer radio frequency powered magnetic flux generating coil 16, there is a corresponding radio frequency magnetic flux through units of U shaped ferromagnetic core assembly 20, extending through window 22 for magnetic flux and radially through the upper volume of reduced pressure plasma process chamber 24. The resulting rotational acceleration of free electrons in the upper volume of reduced pressure plasma process chamber 24 generates the required plasma.

OTHER EMBODIMENTS

Magnetic Flux Blocking—Description

For optimum process uniformity the variation of magnetic flux density with radius from the center of concentric coil planar plasma source 10 should be controlled.

Even with units of U shaped ferromagnetic core assembly 20, there is a tendency for radio frequency magnetic flux generated by outer radio frequency powered magnetic flux generating coil 16 to be concentrated near the turns of outer radio frequency powered magnetic flux generating coil 16.

However, if the same magnetic flux passes from below window 22 for magnetic flux near the center of outer radio frequency powered magnetic flux generating coil 16 to the larger radius return path between outer radio frequency powered magnetic flux generating coil 16 and magnetic flux confining shorted turn coil 12, the flux density will decrease with radius, resulting in a higher radio frequency magnetic flux density near the center of window 22 for magnetic flux than near the edge, with a resulting plasma density radial nonuniformity.

One method of improving radial uniformity is to use conductive magnetic flux blocking surface 34 to prevent radio frequency magnetic flux from passing through an area that is contributing to nonuniformity. Such conductive magnetic flux blocking surface 34 should have a surface of electrically conductive material such as copper, aluminum, or any material with a silver coating. This method of controlling the distribution of the radio frequency magnetic flux can block the magnetic flux from one area and thus concentrate it in another area.

Figure 4:
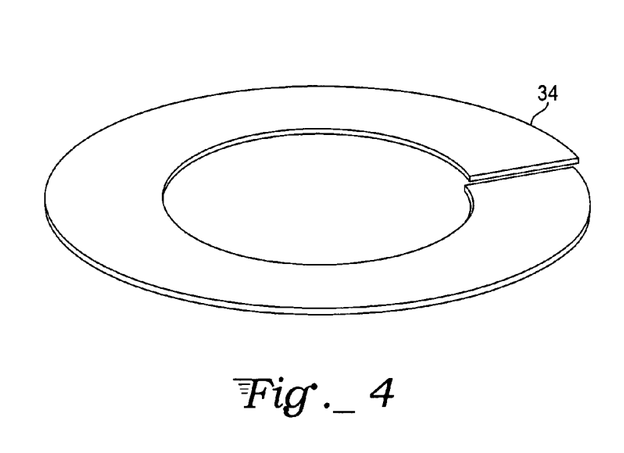
FIG. 4 is a perspective view of a circular conductive magnetic flux blocking surface, with an insulating gap separating overlapping ends.

FIG. 4 is a perspective view of one configuration of conductive magnetic flux blocking surface 34, in this case a washer shaped surface with a single electrically insulated gap and ends overlapping this electrically insulated gap.

Figure 5:
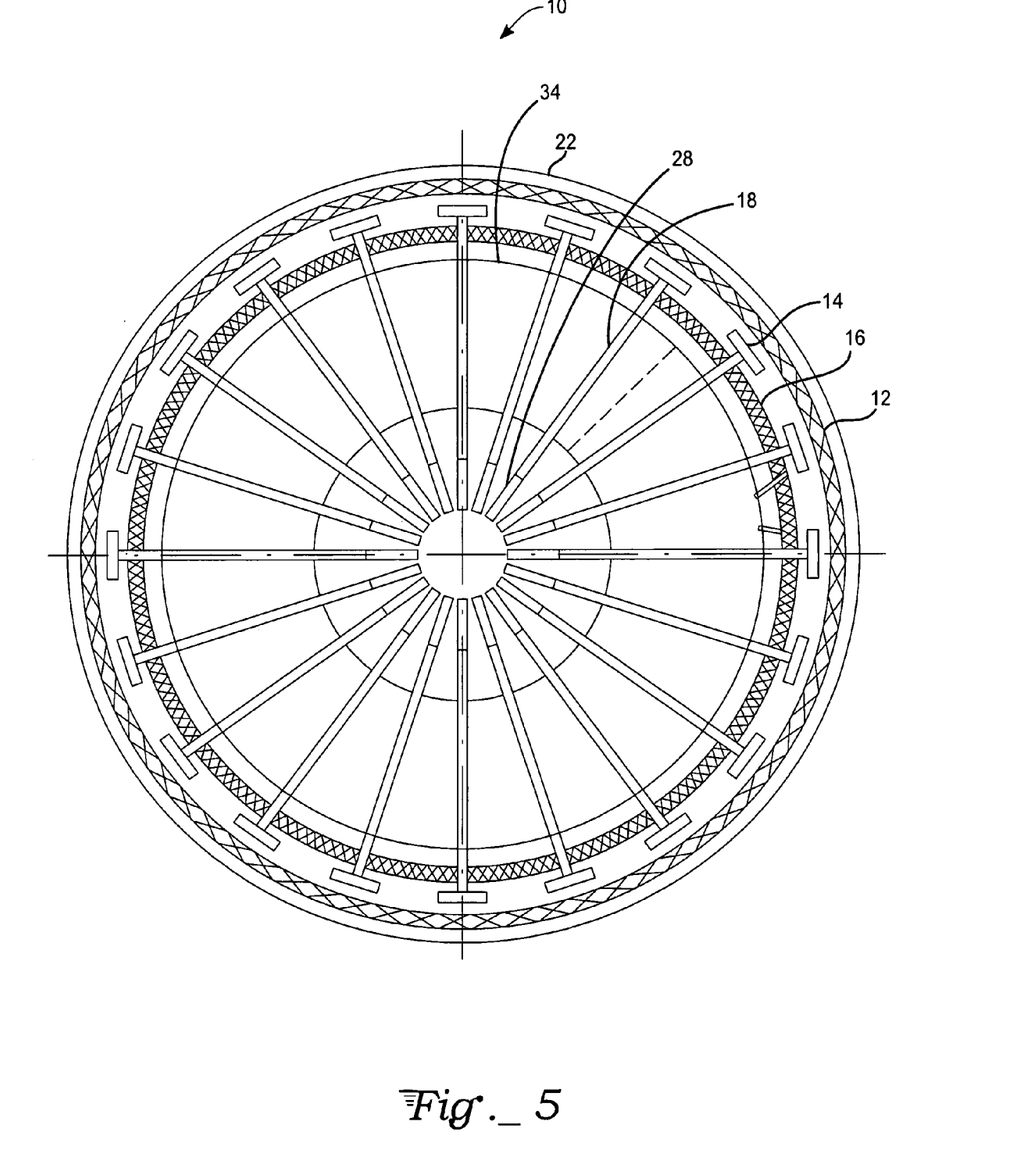
FIG. 5 is a plan view of a two concentric coil planar plasma source with a circular conductive magnetic flux blocking surface placed inside outer radio frequency powered magnetic flux generating coil to control the magnetic flux distribution.

FIG. 5 is a plan view showing conductive magnetic flux blocking surface 34 installed in a two coil embodiment of concentric coil planar plasma source 10. This configuration is useful in blocking radio frequency magnetic flux in the area between outer radio frequency powered magnetic flux generating coil 16 and a circle of units of inner uniformity enhancement ferromagnetic core 28.

The electrically insulated gap in conductive magnetic flux blocking surface 34 is necessary because if conductive magnetic flux blocking surface 34 formed a conductive path surrounding the circle of units of uniformity enhancement ferromagnetic core 28, then by Faraday's law the sum of radio frequency magnetic flux inside conductive magnetic flux blocking surface 34 would be zero, and there would be no magnetic flux through the circle of units of inner uniformity enhancement ferromagnetic core 28.

It is desirable to have overlapping ends with conductive magnetic flux blocking surface 34 to prevent rotational radio frequency magnetic flux density nonuniformity. An alternate radio frequency magnetic flux blocking surface configuration is multiple smaller surfaces with multiple electrically insulating gaps and ends overlapping.

Additional Concentric Coils—Description

More precise control of process uniformity can be achieved by adding additional powered concentric coils and associated ferromagnetic cores.

Figure 6:
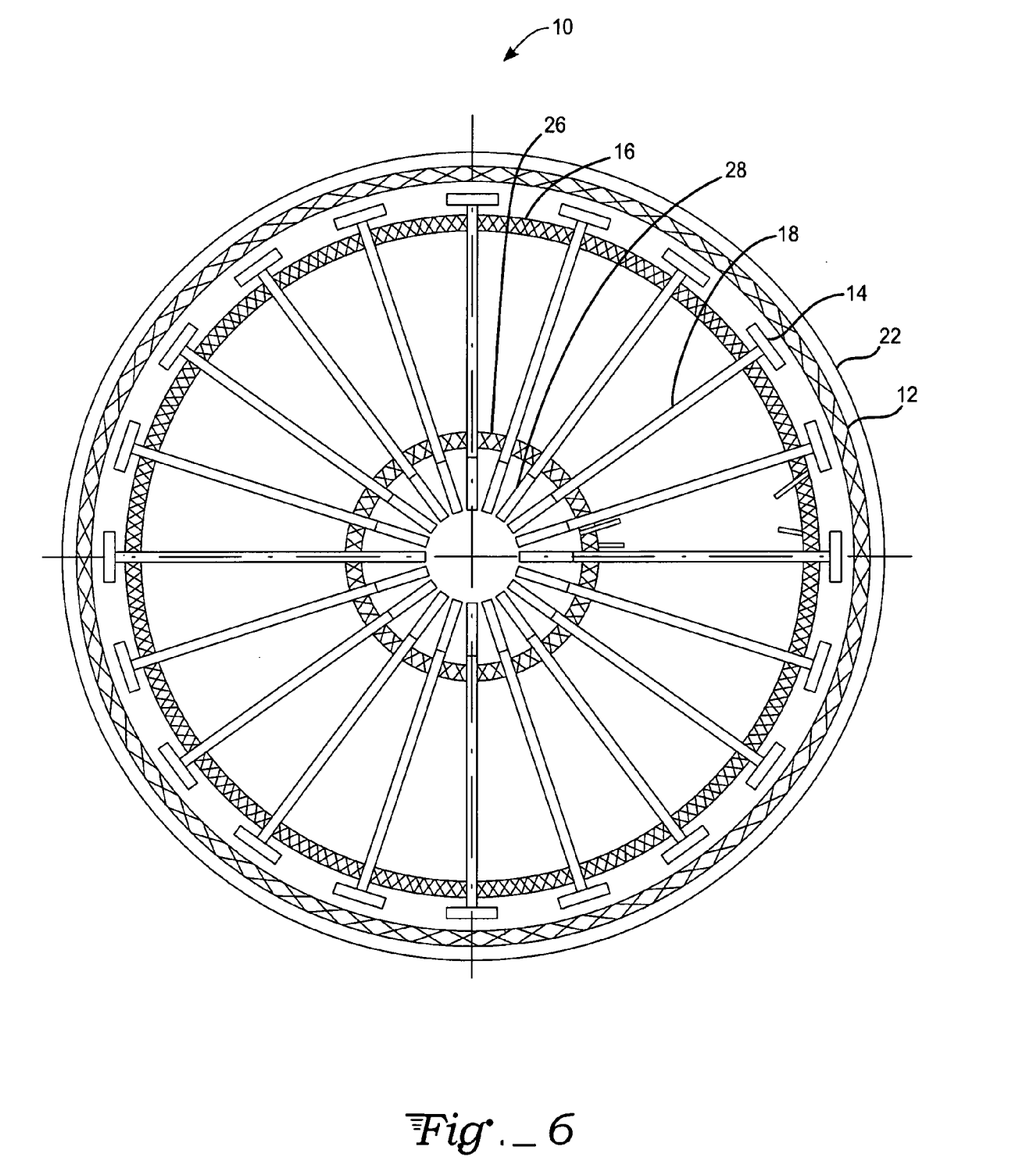
FIG. 6 is a plan view of a three concentric coil planar plasma source, with inner radio frequency powered magnetic flux generating coil surrounding and adjacent to an inner circle of uniformity enhancement ferromagnetic cores.

FIG. 6 is a plan view of a three coil version of concentric coil planar plasma source 10. This configuration is the same as the two coil configuration of FIG. 1, with inner radio frequency powered magnetic flux generating coil 26 added adjacent to and surrounding a circle of units of inner uniformity enhancement ferromagnetic core 28.

For example, if it is desired to have the radio frequency magnetic flux flowing through the circle of units of inner uniformity enhancement ferromagnetic core 28 equal to ⅔rds of the return path magnetic flux flowing between magnetic flux confining shorted turn coil 12 and outer radio frequency powered magnetic flux generating coil 16, then inner radio frequency powered magnetic flux generating coil 26 can have 3/2 times the number of turns of outer radio frequency powered magnetic flux generating coil 16. For example, if outer radio frequency powered magnetic flux generating coil 16 has four turns, then, by Faraday's Law, inner radio frequency powered magnetic flux generating coil should have 6 turns, with radio frequency power applied to the two coils in parallel. The remaining ⅓ of the radio frequency magnetic flux will then flow through the space between outer radio frequency powered magnetic flux generating coil 16 and inner radio frequency powered magnetic flux generating coil 26.

Figure 7:
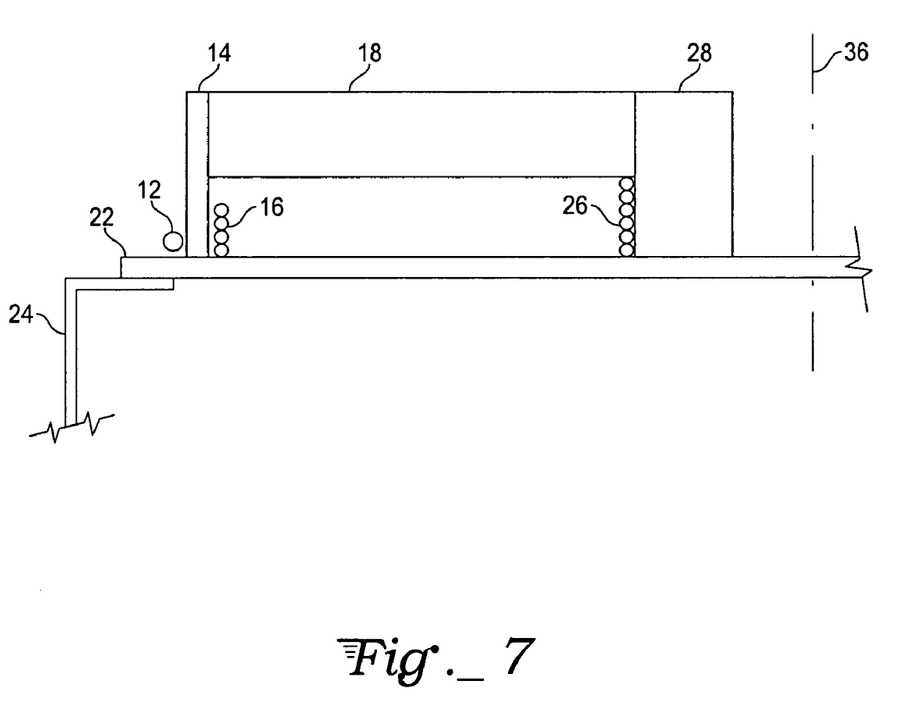
FIG. 7 is a side view of a radius of a three concentric coil planar plasma source showing the inner radio frequency powered magnetic flux generating coil surrounding and adjacent to a uniformity enhancement ferromagnetic core.

FIG. 7 is a side view of a radius of a three coil configuration of concentric coil planar plasma source 10 showing the three concentric coils and associated ferromagnetic core locations.

Figure 8:
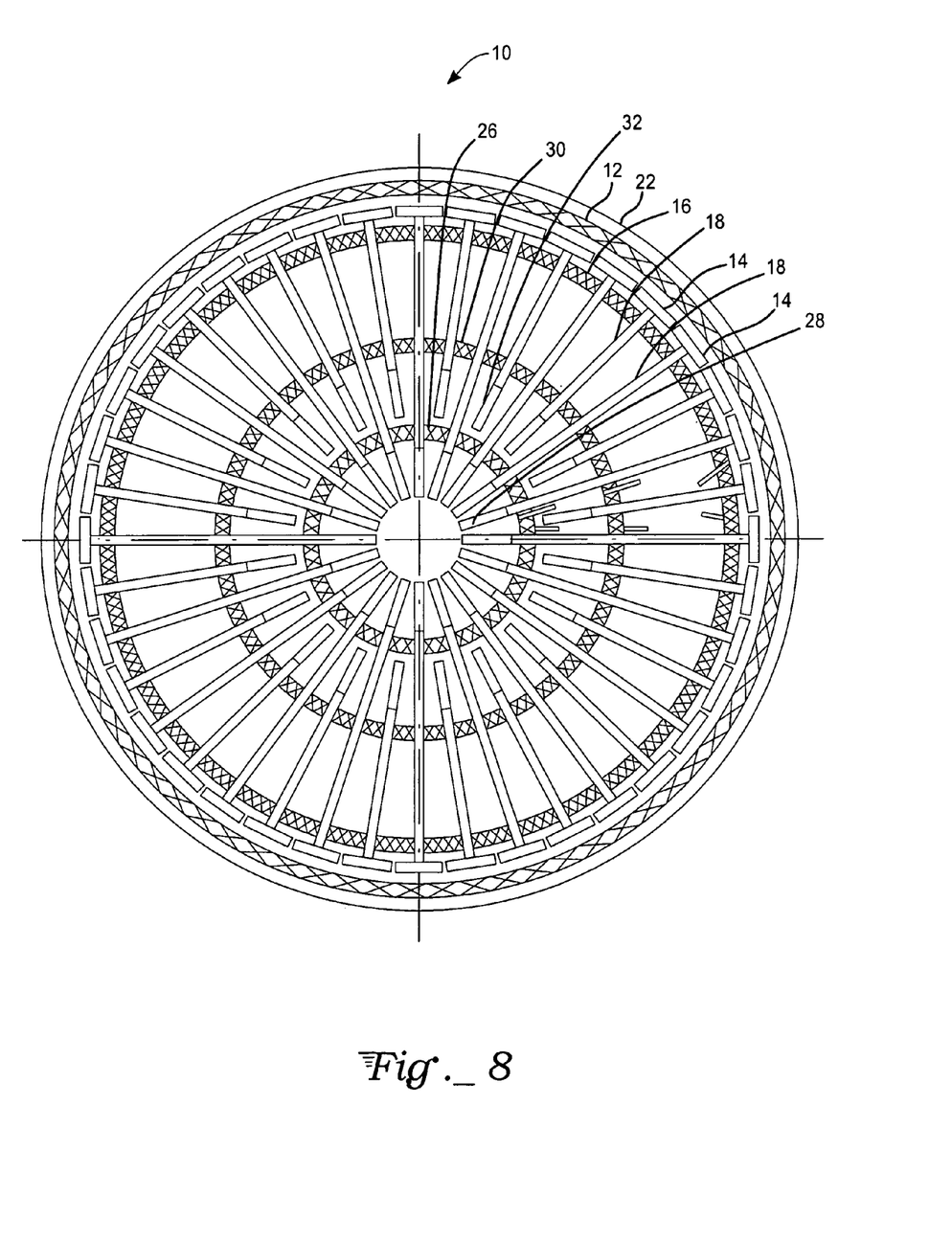
FIG. 8 is a plan view of a four concentric coil planar plasma source, showing the addition of an intermediate radio frequency powered magnetic flux generating coil adjacent to a circle of intermediate uniformity enhancement ferromagnetic cores.

FIG. 8 is a plan view of a four concentric coil configuration of concentric coil planar plasma source 10, with the addition of intermediate radio frequency powered magnetic flux generation coil 30, surrounding a circle of units of intermediate uniformity enhancement ferromagnetic core 32. Each intermediate uniformity enhancement ferromagnetic core 32 is a part of a shorter version of U shaped ferromagnetic core assembly 20.

If outer radio frequency powered magnetic flux generating coil 16 has four turns, inner radio frequency powered magnetic flux generating coil 26 has six turns, intermediate radio frequency powered magnetic flux generation coil 30 has 5 turns, and all three powered coils are connected in parallel, then the total return path magnetic flux will be divided as follows:

The portion of the total return path magnetic flux flowing inside inner radio frequency powered magnetic flux generating coil 26 is $4/6=0.6667$.

The portion of the total return path magnetic flux flowing between intermediate radio frequency powered magnetic flux generation coil 30 and inner radio frequency powered magnetic flux generating coil 26 is $4/5-4/6=0.1333$.

The portion of the total return path magnetic flux flowing between outer radio frequency powered magnetic flux generating coil 16 and intermediate radio frequency powered magnetic flux generation coil 30 is $1-4/5=0.2$. The remaining 0.6667 of the total return path radio frequency magnetic flux flows through inner radio frequency powered magnetic flux generating coil 26.

Figure 9:
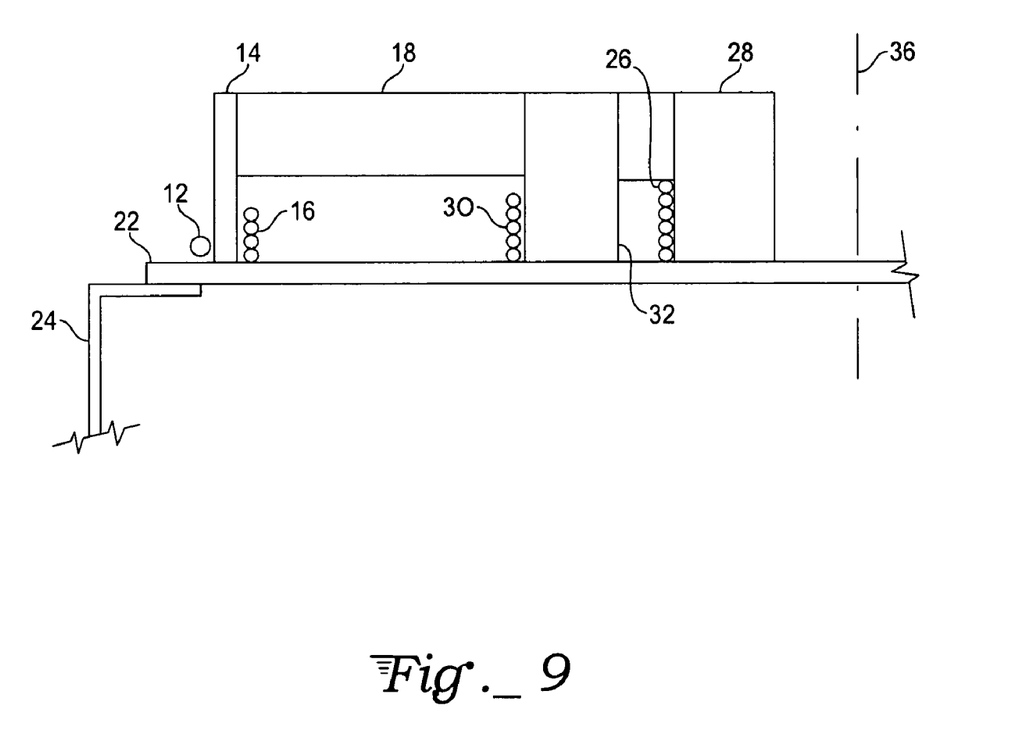
FIG. 9 is a side view of a radius of a four concentric coil planar plasma source, showing the addition of an intermediate radio frequency powered magnetic flux generating coil adjacent to an intermediate uniformity enhancement core.

FIG. 9 is a side view of a radius of a four concentric coil configuration of concentric coil planar plasma source 10, showing the four concentric coils and ferromagnetic core locations. In order of decreasing radius are magnetic flux confining shorted turn 12, return path ferromagnetic core 14, outer radio frequency powered magnetic flux generating coil 16, intermediate radio frequency powered magnetic flux generation coil 30, intermediate uniformity enhancement ferromagnetic core 32, inner radio frequency powered magnetic flux generating coil 26, inner uniformity enhancement ferromagnetic core 28, and concentric coil source axis 36.

Methods of controlling the radial variation of radio frequency magnetic flux include using different numbers of turns for each driven concentric coil and connecting the driven concentric coils in parallel to the radio frequency power source, using driven concentric coils with the same number of turns with a multiple output voltage source, and by using a combination of varying numbers of turns and a multiple output voltage source.

Use of Structural Shorted Turn—Description

If the structure supporting window 22 for magnetic flux includes conductive structure which approximates the position of magnetic flux confining shorted turn coil 12, then separate magnetic field confining shorted turn 12 is not necessary. Such a conductive structure is typically used to support window 22 for magnetic flux. The fact that the shorted turn of this support structure is below window 22 for magnetic flux, rather than above it, does not prevent it from serving as a shorted turn to confine the magnetic flux. However, resistive losses in the structural support shorted turn can be reduced by adding magnetic flux confining shorted turn 12 made of a more conductive material such as copper, or silver plated copper, and with rounded surfaces to prevent current concentration at corners.

Rectangular Configuration—Description

While most semiconductor processing plasma sources generate a circular plasma to conform to the circular shape of most semiconductor wafers, there is also a requirement for rectangular or other shaped plasma sources for flat panel displays and similar workpieces. The same principles apply for plasma sources for concentric coils with ferromagnetic cores in shapes other than circular.

CONCLUSIONS, RAMIFICATIONS, AND SCOPE

Accordingly, it can be seen that concentric coil planar plasma source 10 provides control of magnetic reluctance through the entire closed magnetic path, by using return path ferromagnetic cores 14 to reduce the magnetic reluctance through the coaxial space between outer radio frequency powered magnetic flux generating coil 16 and magnetic flux confining shorted turn coil 12, and by adjusting the radial location of radio frequency magnetic flux through the use of units of inner uniformity enhancement ferromagnetic core 28.

Additional control over the radial distribution of radio frequency magnetic flux can be provided through the use of conductive magnetic flux blocking surface 34 and multiple driven coaxial coils in conjunction with associated units of intermediate uniformity enhancement ferromagnetic core 32.

Although the description above contains many specificities, these should not be construed as limiting the scope of the invention but as merely providing illustrations of some of the presently preferred embodiments of this invention. Various other embodiments and ramifications are possible within it's scope.

Thus the scope of the invention should be determined by the appended claims and their legal equivalents, rather than by the examples given.

What is claimed is:

1. A plasma generator comprising:
   a plasma reactor having a magnetically transparent window and a central axis;
   a plurality of spaced apart magnetic cores, wherein each magnetic core includes an axially symmetric U-shaped magnetic core having a first radially inward portion spaced apart from but proximate to said central axis of the reactor and a second radially outward portion joined to the radially inward portion by a bridging portion and having an open U-shaped portion opposite the bridging portion and proximate to the magnetically transparent window;
   a first radio frequency coil concentric with said central axis proximate to the second radially outward portion of the core in a magnetically inductive relation with the core whereby magnetic flux is coupled into the core;

a second coil having at least one shorted turn concentric with said central axis and with the first coil and proximate to the second radially outward portion of the core on a side of the second portion of the U-shaped core which is radially different from the first coil whereby the first coil, second radially outward portion of the core and second coil are all concentric;

whereby magnetic flux from the radially inward portion of the core passes through the window into the reactor and loops back through the window into the radially outward portion of the core.

* * * * *